United States Patent
Liu et al.

(10) Patent No.: US 7,821,114 B2
(45) Date of Patent: Oct. 26, 2010

(54) MULTIPHASE SYNCHRONOUS BUCK CONVERTER

(75) Inventors: Yong Liu, Scarborough, ME (US); Tiburcio A. Maldo, Suzhou (CN); Hua Yang, Suzhou (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 39 days.

(21) Appl. No.: 12/405,525

(22) Filed: Mar. 17, 2009

(65) Prior Publication Data
US 2009/0189273 A1   Jul. 30, 2009

Related U.S. Application Data

(63) Continuation-in-part of application No. 12/020,892, filed on Jan. 28, 2008, now Pat. No. 7,696,612.

(51) Int. Cl.
*H01L 23/495* (2006.01)

(52) U.S. Cl. .......... 257/666; 257/76; 257/686; 257/E23.042; 438/123; 438/109

(58) Field of Classification Search ............. 257/666, 257/E23.042
See application file for complete search history.

(56) References Cited

U.S. PATENT DOCUMENTS

| | | | |
|---|---|---|---|
| 6,043,430 A * | 3/2000 | Chun | ............ 174/530 |
| 6,803,750 B2 | 10/2004 | Zhang | |
| 2007/0249092 A1 | 10/2007 | Joshi | |
| 2008/0061396 A1* | 3/2008 | Havanur | ......... 257/500 |
| 2009/0189262 A1 | 7/2009 | Liu et al. | |

* cited by examiner

*Primary Examiner*—Thao X Le
*Assistant Examiner*—Ajay K. Arora
(74) *Attorney, Agent, or Firm*—Hiscock & Barclay, LLP

(57) ABSTRACT

Disclosed in this specification is a multiphase buck converter package and process for forming such package. The package includes at least four dice and several parallel leads. The dice are electrically connected through a plurality of die attach pads, thus eliminating the need for wirebonding.

13 Claims, 11 Drawing Sheets

US 7,821,114 B2

MULTIPHASE SYNCHRONOUS BUCK CONVERTER

CROSS-REFERENCE TO RELATED APPLICATIONS

This application is a continuation-in-part of co-pending U.S. patent application Ser. No. 12/020,892, filed Jan. 28, 2008, which application is incorporated herein by reference in its entirety.

FIELD OF THE INVENTION

This invention relates, in one embodiment, to a multiphase buck converter package. A single molded package is provided which incases at least four MOSFET dice and a plurality of leads. The dice are electrically connected in a predetermined configuration using lead frame. Wirebonding techniques are not required to connect the dice. In one embodiment, the leads all extend in the same direction.

BACKGROUND OF THE INVENTION

Buck converters are switching circuits that downgrade a received voltage to a lower, output voltage. Such circuits are commonly used to power microprocessors, wherein the voltage desired by the microprocessor is substantially lower than the voltage supplied by the power supply. In a multiphase buck converter, a plurality of dice are operated in sequence to downgrade the voltage. Thus, each die contributes a portion of the desired current. Reference may be had to U.S. Pat. No. 6,803,750 to Zhang (Multiphase Synchronous Buck Converter with Improved Current Sharing).

Unfortunately, prior art multiphase buck converters are not modular units. Therefore, a multiphase buck converter package is desired which would easily permit a user to add such a converter to an existing circuit.

SUMMARY OF THE INVENTION

The invention comprises, in one form thereof, a multiphase buck converter package. The package includes at least four dice. The dice are electrically connected through a plurality of die attach pads, thus eliminating the need for wirebonding.

An advantage of the present invention is the modular nature of the package. A user may easily add a multiphase buck converter package into an existing circuit to increase its ability to respond to dynamic changes in the load current, resulting in a significant improvement in performance.

BRIEF DESCRIPTION OF THE DRAWINGS

The present invention is disclosed with reference to the accompanying drawings, wherein.

Corresponding reference characters indicate corresponding parts throughout the several views. The examples set out herein illustrate several embodiments of the invention but should not be construed as limiting the scope of the invention in any manner.

DETAILED DESCRIPTION OF A PREFERRED EMBODIMENT

Figure 1:
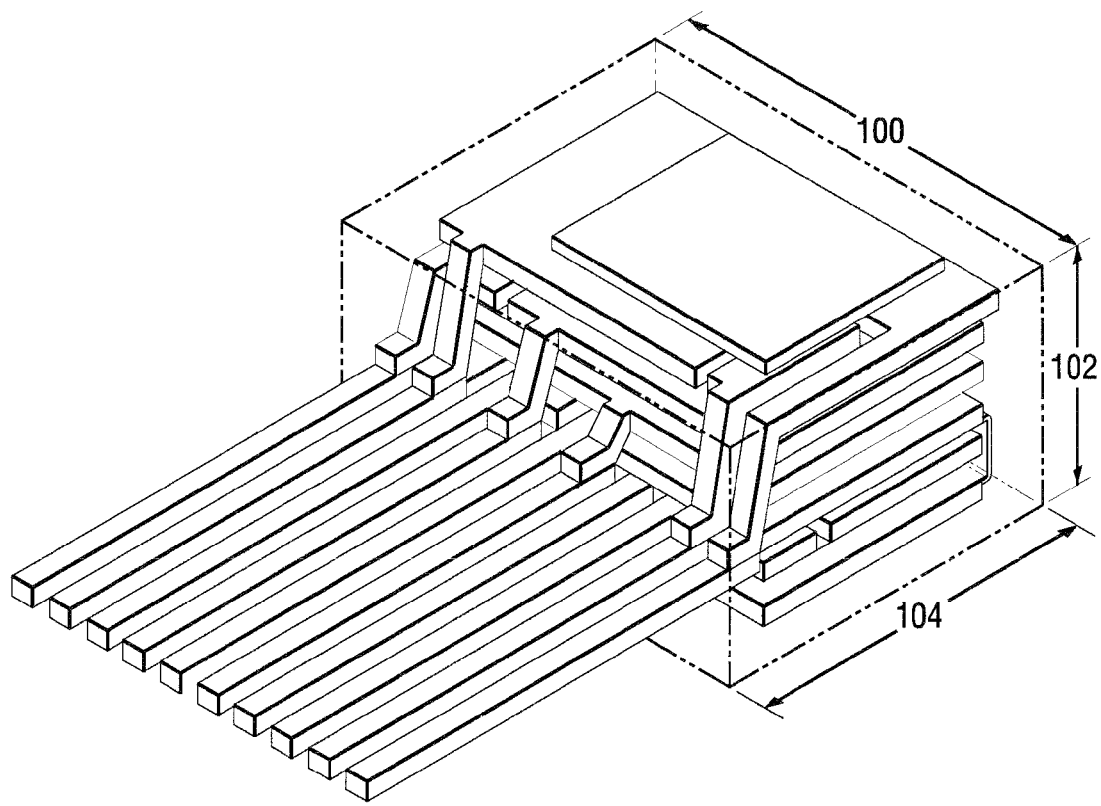
FIG. 1 is a perspective view of a first embodiment of the invention.
Figure 2:
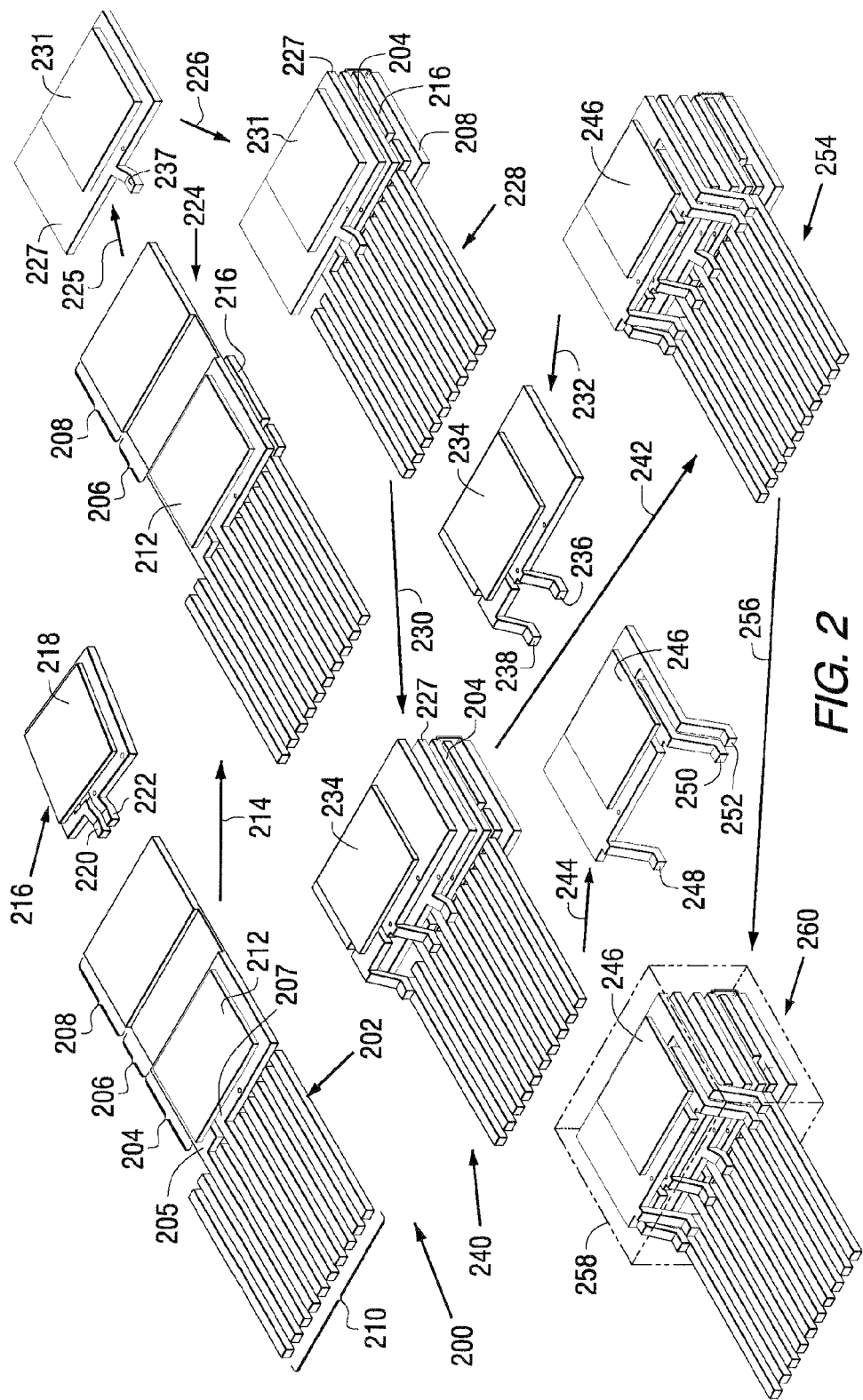
FIG. 2 is a flow diagram of a process for forming the first embodiment.

Referring to FIG. 1, a multiphase buck converter package is shown. The embodiment of FIG. 1 has a certain width 100 and a height 102 suitable to accommodate a plurality of die attach pads 104 in a vertical configuration. In other embodiments (see FIG. 6) the width and height may be altered to accommodate non-vertical configurations. FIG. 2 is a flow diagram depicting a process for forming the buck converter package of FIG. 1.

Process 200 of FIG. 2 begins with first lead frame 202. First lead frame 202 includes a plurality of leads 210, in particular ten leads, a first die attach pad 204, a first die 212 on the upper surface of pad 204, a second die attach pad 208, and a bridge 206 connecting pad 204 and pad 208. In the embodiment shown in FIG. 2, first die 212 is a MOSFET with source, gate and drain terminals. First lead 205 is a gate lead which is connected to the gated first die 212 and is separated from first pad 204. Second lead 207, bridge 206, first pad 204 and second pad 208 are unitary. In one embodiment, connecting bridge 206 is thinner than pads 204 and 208. Such a configuration facilitates the bending operation performed in step 226. The other leads shown in FIG. 2 are not connected to die attach pad 204.

As shown in FIG. 2, first die 212 has been mounted to first pad 204 such that the source of first die 212 is electrically connected to second lead 207 and the gate of first die 212 is electrically connected to first lead 205. The drain of first die 212 is exposed.

In step 214 of process 200, a third die attach pad 216 is attached to the underside of first pad 204 to form assembly 224. After attachment, the third die attach pad 216 is disposed in a plane that is parallel to, but separated from, the planes of both first pad 204 and second pad 206. Third die attach pad 216 includes second die 218 whose source is connected to third lead 222 and whose gate is connected to fourth lead 220. In FIG. 2, at step 214 third pad 216 is shown in an inverted state to better depict second die 218. The bottom surface (not shown) of third pad 216 is protected with a layer of insulating material. In step 214, third pad 216 is attached to the lower surface of die attach pad 204 such that the insulating material is adjacent to the bottom surface of pad 204. Third lead 222 and fourth lead 220 are extended in length by contacting corresponding leads from the plurality of leads 210. In this manner, the source of second die 218 has been connected to third lead 222 and the gate of second die 218 has been connected to fourth lead 220. The drain of first die 212 and second die 218 are exposed in step 214.

In step 225, fourth pad 227 is disposed atop first die 212 such that fifth lead 237 is placed in electrical communication with the drain of first die 212. Fourth pad 227 has an insulator 231 on its top surface which prevents it from making an electrical connection to fifth die attach pad 232 that is installed in step 226. Insulator 231 may be, for example, a direct copper bonding insulator.

In step 226, second die attach pad 208 is bent about bridge 206 to form assembly 228 such that second die attach pad 208 contacts the exposed drain of second die 218. In FIG. 2, bridge 206 is bent into a simple U shape, although other shapes are permissible. Step 226 connects the drain of second die 218 to second lead 207 by forming an electrical pathway from the drain of second die 218, through the second pad 208, the bridge 206, first pad 204, and finally to second lead 207. The second die attach pad 208 is now disposed in a plane parallel to, but separated from, the planes of the first pad 204 and third pad 216.

In step 230 a fifth die attach pad 232 is mounted atop fourth pad 227. The fifth die attach pad 232 is disposed in a plane that is parallel to, but separated from, the planes of the first pad 204, second pad 208, third pad 216, and fourth pad 227. Fifth die attach pad 232 includes third die 234 whose gate is connected to sixth lead 238 and whose source is connected to seventh lead 236. Sixth lead 238 and seventh lead 236 are extended in length by contacting corresponding leads from the plurality of leads 210. The bottom surface of fifth pad 232 contacts the insulator 231 of fourth pad 227. In this manner, the source of third die 234 has been connected to seventh lead 236, and the gate of third die 234 has been connected to sixth lead 238. In assembly 240, the drain of third die 234 is exposed.

In step 242 of process 200, sixth die attach pad 244 is mounted atop the exposed drain of third die 234. Sixth die attach pad 244 includes fourth die 246 whose source is connected to eighth lead 248, and whose gate is connected to ninth lead 250, and whose drain is connected to tenth lead 252. Eighth lead 248, ninth lead 250 and tenth lead 252 are extended in length by contacting corresponding leads from the plurality of leads 210. After mounting, eighth lead 248 is now connected to the source of fourth die 246 and the drain of third die 234 (through sixth die attach pad 244).

In step 256, assembly 254 is encased in molding compound 258 to form package 260. The resulting assembly is comprised of four dies which are connected in series. Such a configuration is represented schematically in FIG. 3.

Figure 3:
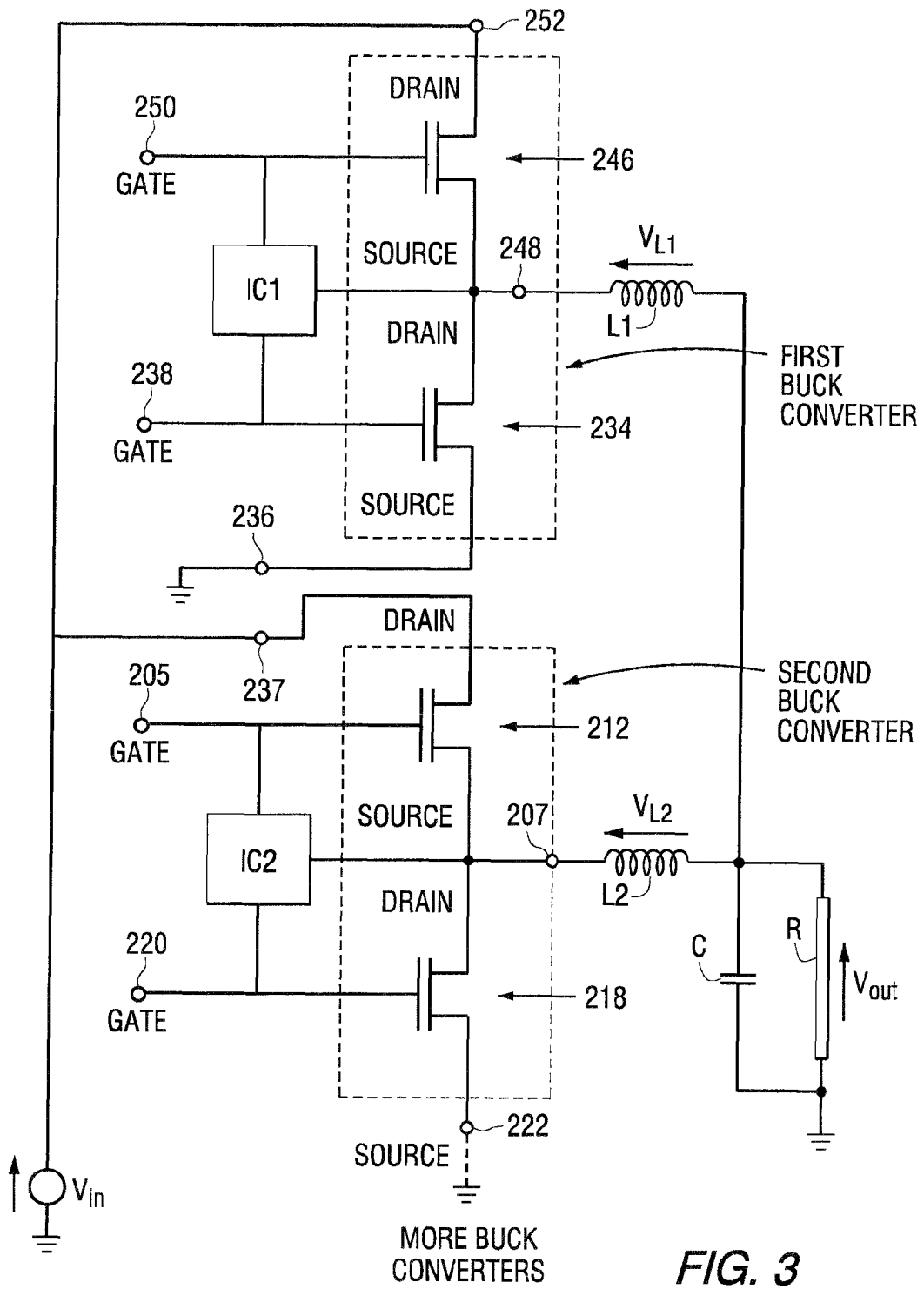
FIG. 3 is a schematic diagram of the circuit of the first embodiment.

FIG. 3 is a schematic diagram of one embodiment of the invention for a two phase buck converter. In FIG. 3, eighth lead 248 connects to an inductor L1 and second lead 207 connects to an inductor L2. High side gate lead 250 and low side gate lead 238 of the first buck converter are connected to a driver chip IC1 which controls the high side and low side switch of the first buck converter. High side gate lead 205 and low side gate lead 220 of the second buck converter are connected to a driver chip IC2 which controls the high side and low side switch of the second buck converter.

Figure 4:
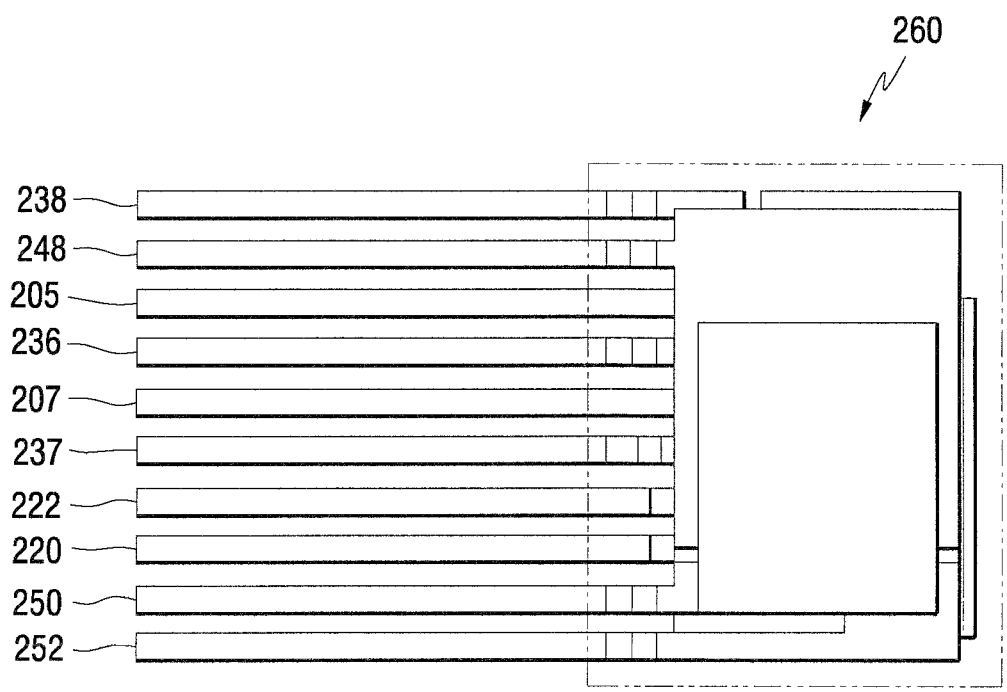
FIG. 4 is a top view of the first embodiment illustrating the various leads.

FIG. 4 is a depiction of the function of the various leads of package 260. Lead 237 connects to the drain lead for first die 212. Lead 238 connects to the gate lead for third die 234. Lead 248 connects to the source of the fourth die 246 and drain of the third die 234. Lead 205 connects to the gate lead for first die 212. Lead 236 connects to the source of third die 234. Lead 207 connects to the source of first die 212 and the drain of second die 218. Lead 222 connects to the source lead for second die 218. Lead 220 connects to the gate lead for second die 218. Lead 250 controls the gate of fourth die 246. Lead 252 connects to the drain lead for fourth die 246.

Figure 5:
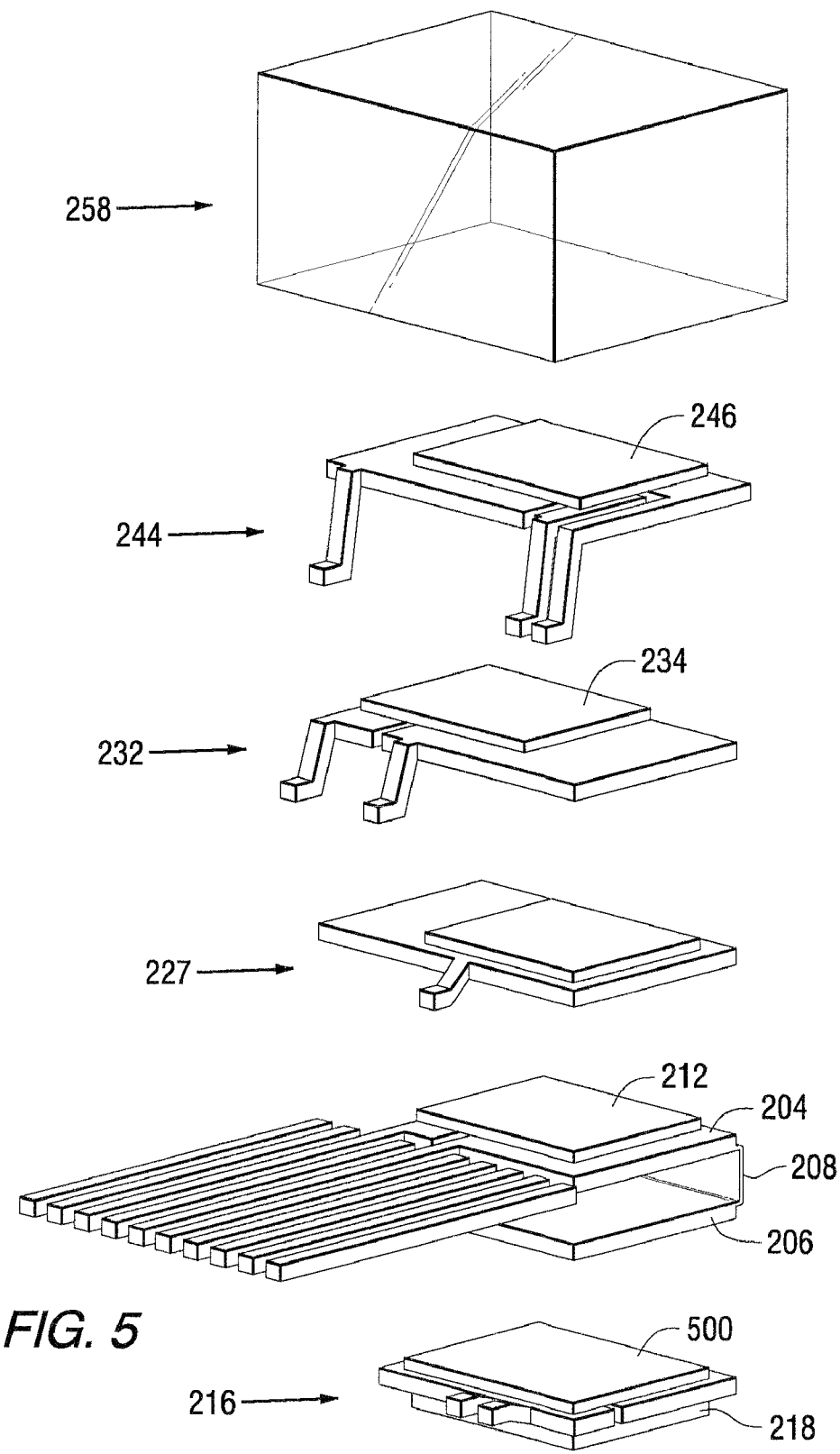
FIG. 5 is an exploded view of the first embodiment.

FIG. 5 is an exploded view of the components of the package of FIG. 1. The insulating material 500 that is disposed between first pad 204 and third pad 216 is visible in this view.

Figure 6:
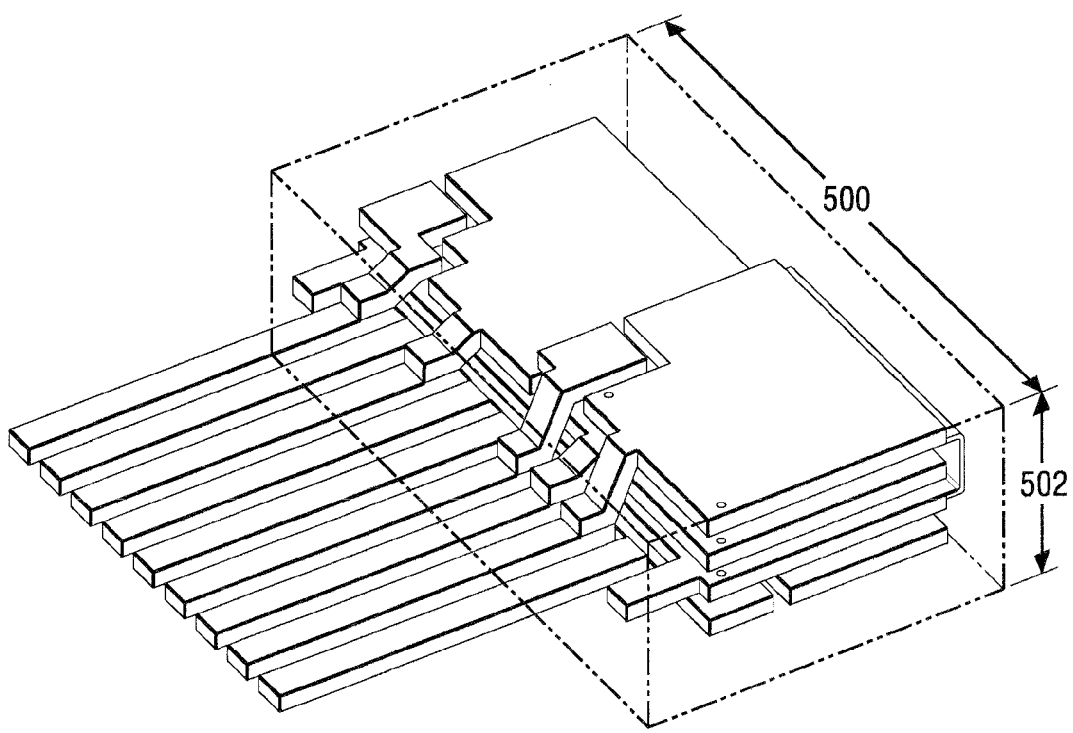
FIG. 6 is a perspective view of a second embodiment of the invention.

FIG. 6 is a perspective view of another embodiment of the invention. In FIG. 6, the package has a width 500 and height 502. Width 500 of FIG. 6 is substantially longer than width 100 of FIG. 1, while height 502 is substantially smaller than height 102. Each of the embodiments shown in FIGS. 1 and 2 are useful in different situations.

Figure 7:
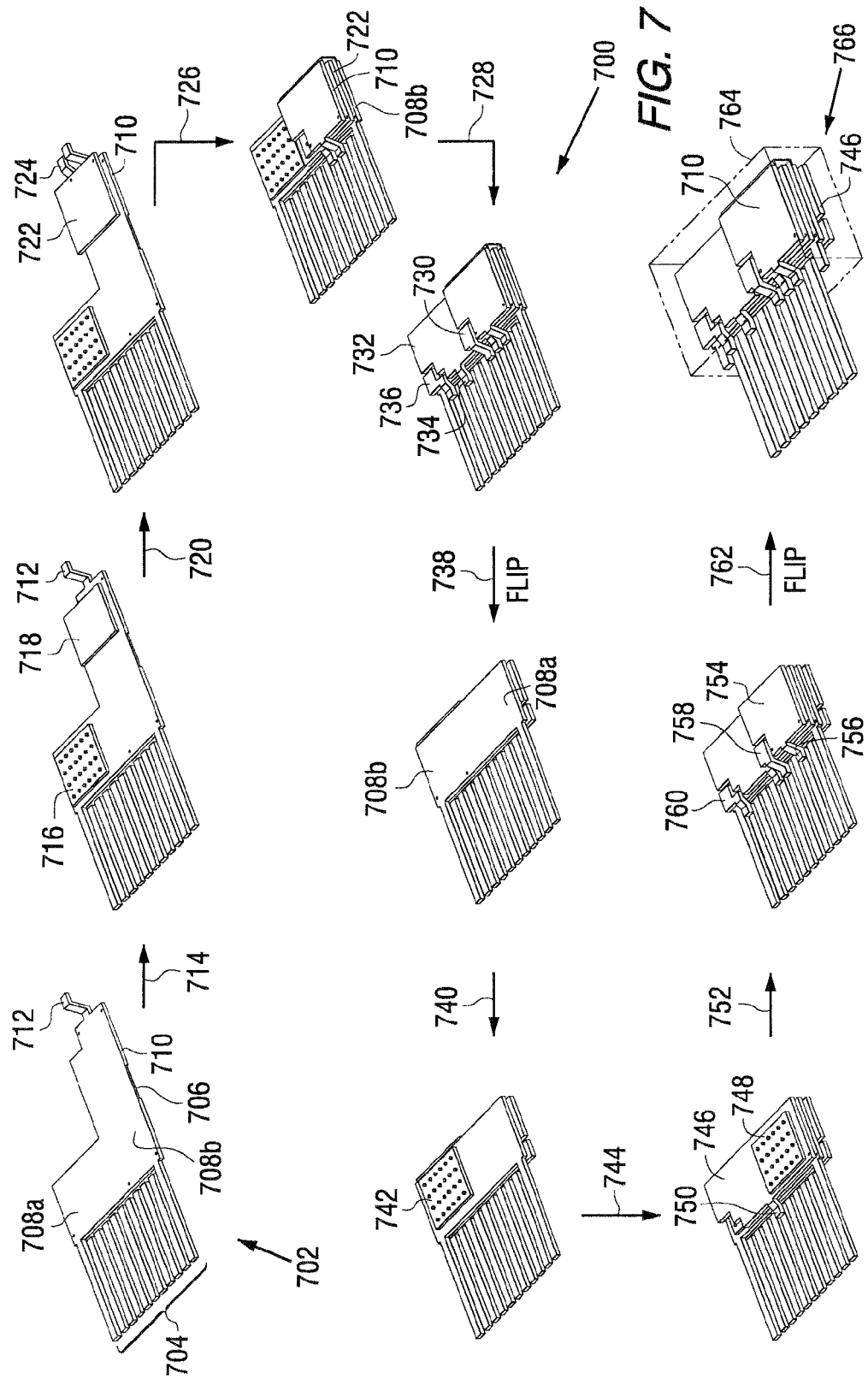
FIG. 7 is a flow diagram of a process for forming the second embodiment.

FIG. 7 is a flow diagram of a process 700 for forming the package of FIG. 6. Process 700 begins with lead frame 702, which includes first die attach pad 708a, second die attach pad 708b, and third die attach pad 710. Second pad 708b and third pad 710 are joined by conductive bridge 706. Lead frame 702 also includes a plurality of leads 704. In the embodiment depicted in FIG. 7, the two flanking leads, the first pad 708a, second pad 708b, third pad 710 and bridge 706 are unitary. The non-flanking leads will be connected to the internal components of the package during subsequent steps. Third pad 710 includes first lead 712.

In step 714 of process 700, first die 716 and second die 718 are mounted to lead frame 702. First die 716 is flip-chip mounted, such that the drain of first die 716 contacts first pad 708a. Second die 716 is mounted in a conventional fashion such that the source of second die 718 contacts third pad 710. This places lead 712 in electrical contact with both the drain of first die 716 and the source of second die 718.

In step 720, fourth die attach pad 722 is mounted to second die 718 such that is contacts the drain of die 718. Fourth pad 722 includes second lead 724, which is now in electrical contact with the drain of second die 718.

In step 726 of process 700, bridge 706 is bent such that third pad 710 is disposed atop second pad 708b. When first lead 712 and second lead 724 contact corresponding leads of the plurality of leads 704, the length of first lead 712 and second lead 724 are extended. Contact between the exposed surface of fourth pad 722 and second pad 708b is prevented. Such contact may be prevented by coating the exposed surface of fourth pad 722 with an insulating material or by simply leaving a space between fourth pad 722 and second pad 708b.

In step 728 fifth die attach pad 732, which includes third lead 734, is mounted atop first die 716 such that the source of first die 716 contacts fifth pad 732. The length of third lead 734 is extended by contact with one of the leads of the plurality of leads 704. Also in step 728, fourth lead 736 is attached to the gate of first die 716 and fifth lead 730 is attached to the gate of second die 718.

In step 738, the assembly is flipped to perform operations on the bottom side of lead frame 702. In another embodiment, not shown, the operations are performed on the bottom of lead frame 702 without flipping the frame 702.

In step 740 of process 700, third die 742 is mounted to the bottom of second pad 708b such that the drain of third die 742 is connected to first lead 712.

In step 744, sixth die attach pad 746, which includes fourth die 748 and sixth lead 750. Fourth die 748 is mounted to sixth die attach pad 746 such that the drain of fourth die 748 contacts sixth pad 746, and thus sixth lead 750. The length of sixth lead 750 is extended by contact with one of the leads of the plurality of leads 704.

In step 752, seventh die attach pad 754 is mounted to fourth die 748 such that seventh pad 754 is connected to the source of fourth die 748. Seventh pad 754 includes seventh lead 756, which is extended in length by contact with one of the leads from the plurality of leads 704. In step 752, eighth lead 760 is connected to the gate of third die 742 and ninth lead 758 to the gate of fourth die 758.

In step 762, the assembly is encased within molding compound 764 to form assembly 766. In the embodiment depicted in FIG. 7, assembly 766 is show front a viewpoint such that third pad 710 is on top and sixth pad 746 is on the bottom.

Figure 8:
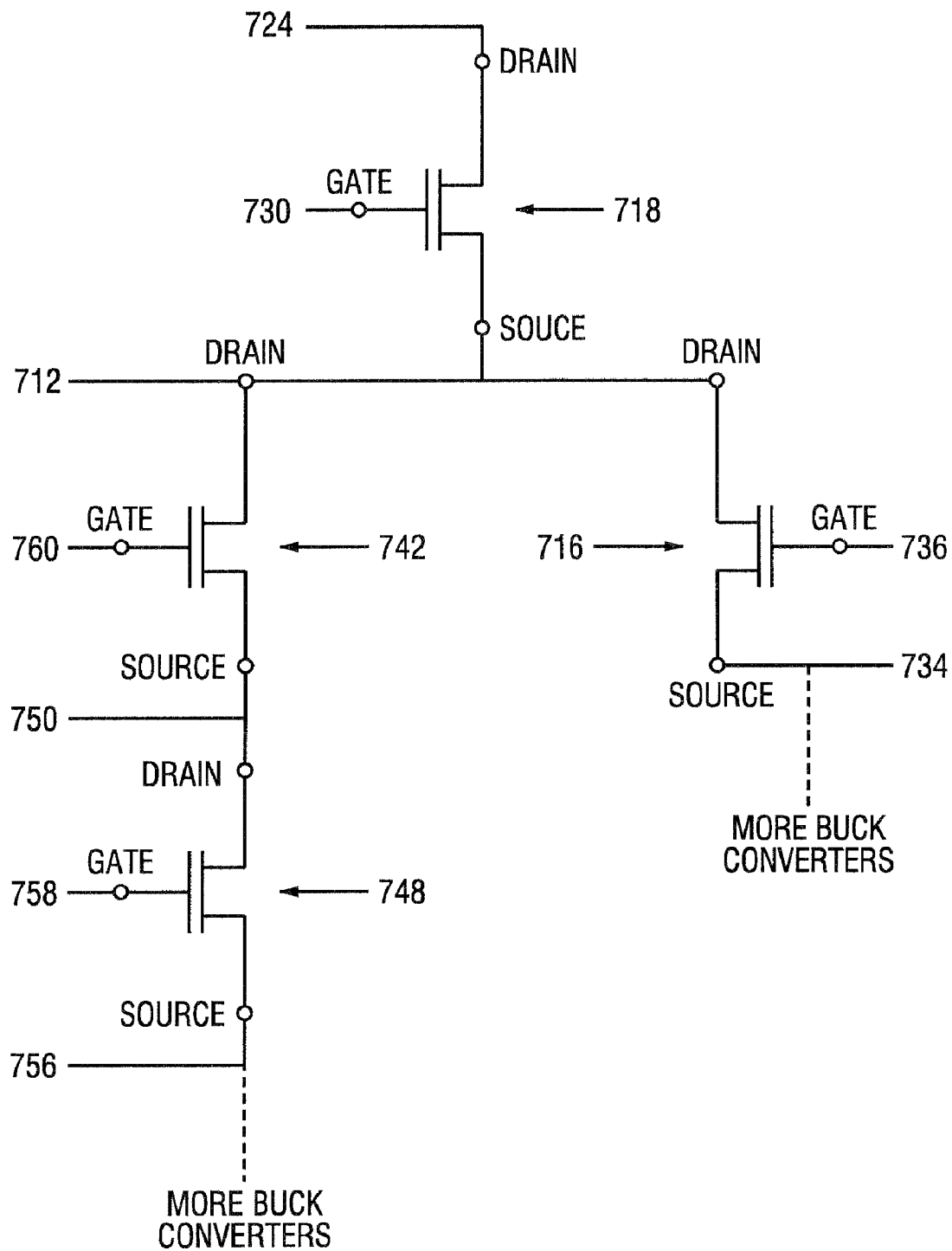
FIG. 8 is a schematic diagram of the circuit of the second embodiment.

FIG. 8 is a schematic diagram of the circuit of the embodiment shown in FIG. 6. This is a more flexible circuit connection which allows the users to have an option to add the embodiment to their own defined circuitry. The users may build or add more parallel buck converters under a switch through leads 734 and 756 to form any system the users wish to obtain.

Figure 9:
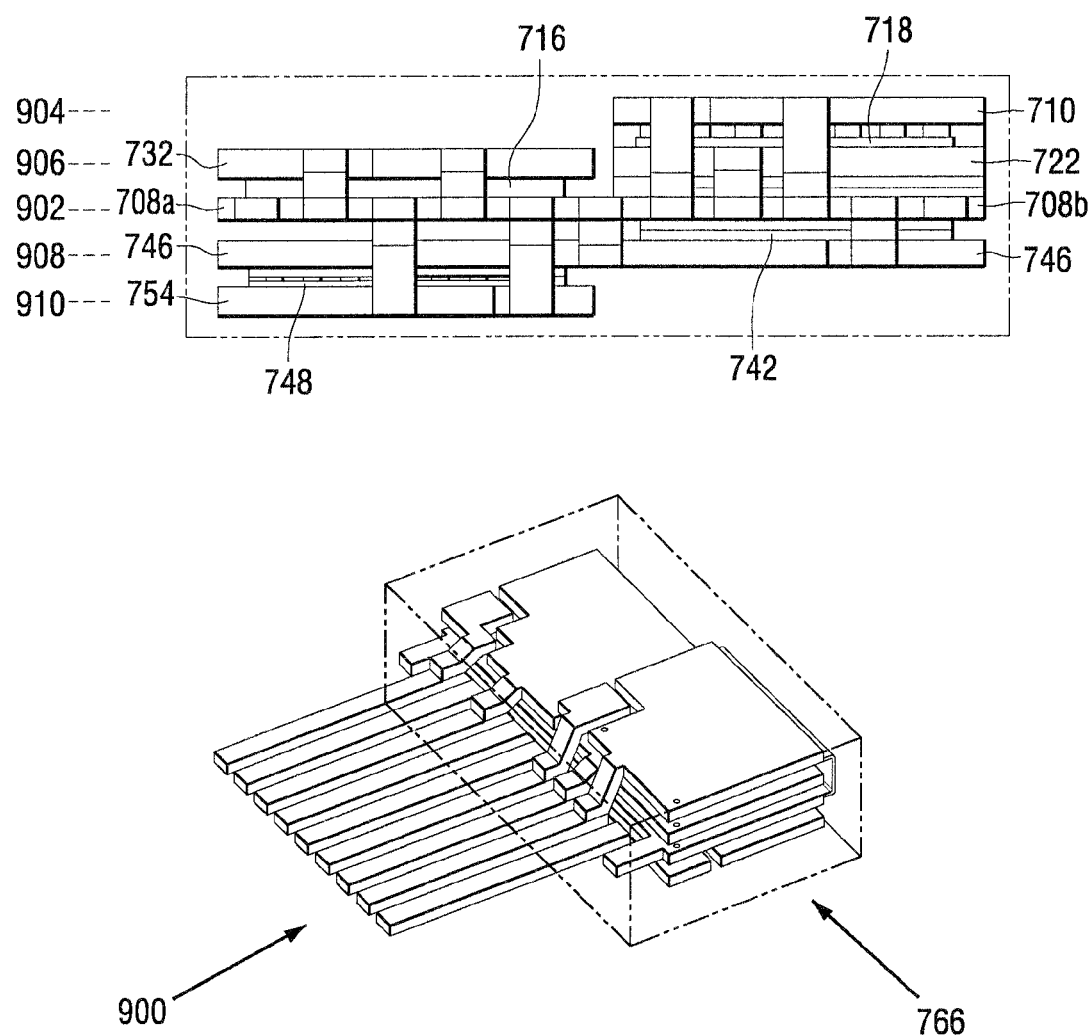
FIG. 9 is an end view of the second embodiment.

FIG. 9 is an end view of package 766 looking from the perspective of arrow 900. First die 716, second die 718, third die 742 and fourth die 748 are shown. First die attach pad 708a and second pad 708b are disposed in first plane 902. Third pad 710 is disposed in second plane 904. Fourth pad 722 and fifth pad 732 are both disposed in third plane 906. Sixth pad 746 is in fourth plane 908. Seventh pad 754 is in fifth plane 910.

Figure 10:
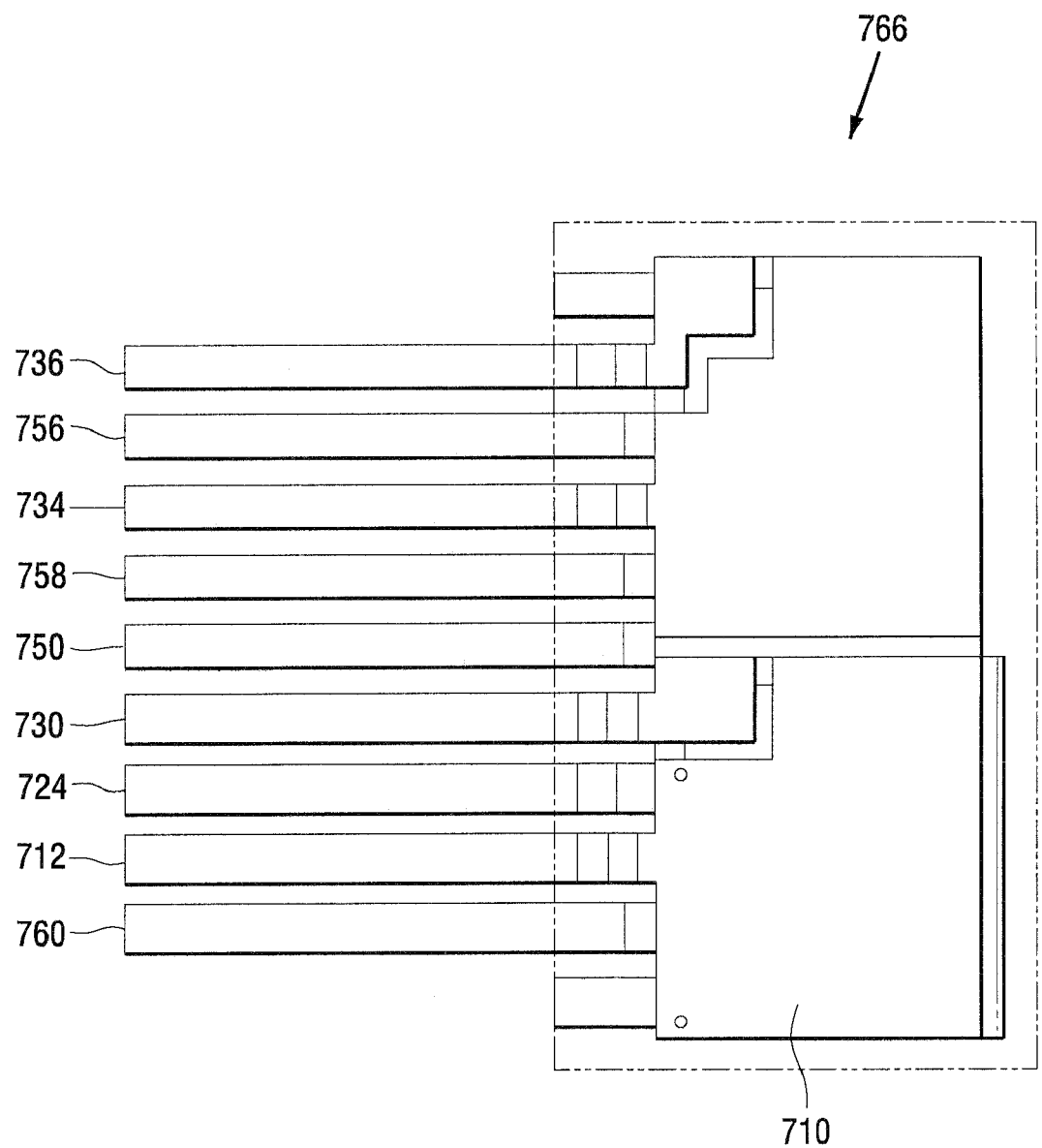
FIG. 10 is a top view of the second embodiment illustrating the various leads.

FIG. 10 illustrates the function of the various leads of package 766. Package 766 includes first die 716, second die 718, third die 742 and fourth die 748, which has a gate, source and drain. First lead 712 is connected to the third drain, first drain and second source. Second lead 724 is connected to the second drain. Third lead 734 is connected to the first source. Fourth lead 736 is connected to the first gate. Fifth lead 730 is connected to the second gate. Sixth lead 750 is connected to the third source and fourth drain. Seventh lead 756 is connected to fourth source. Eighth lead 760 is connected to the third gate. Ninth lead 758 is connected to the fourth gate.

Figure 11:
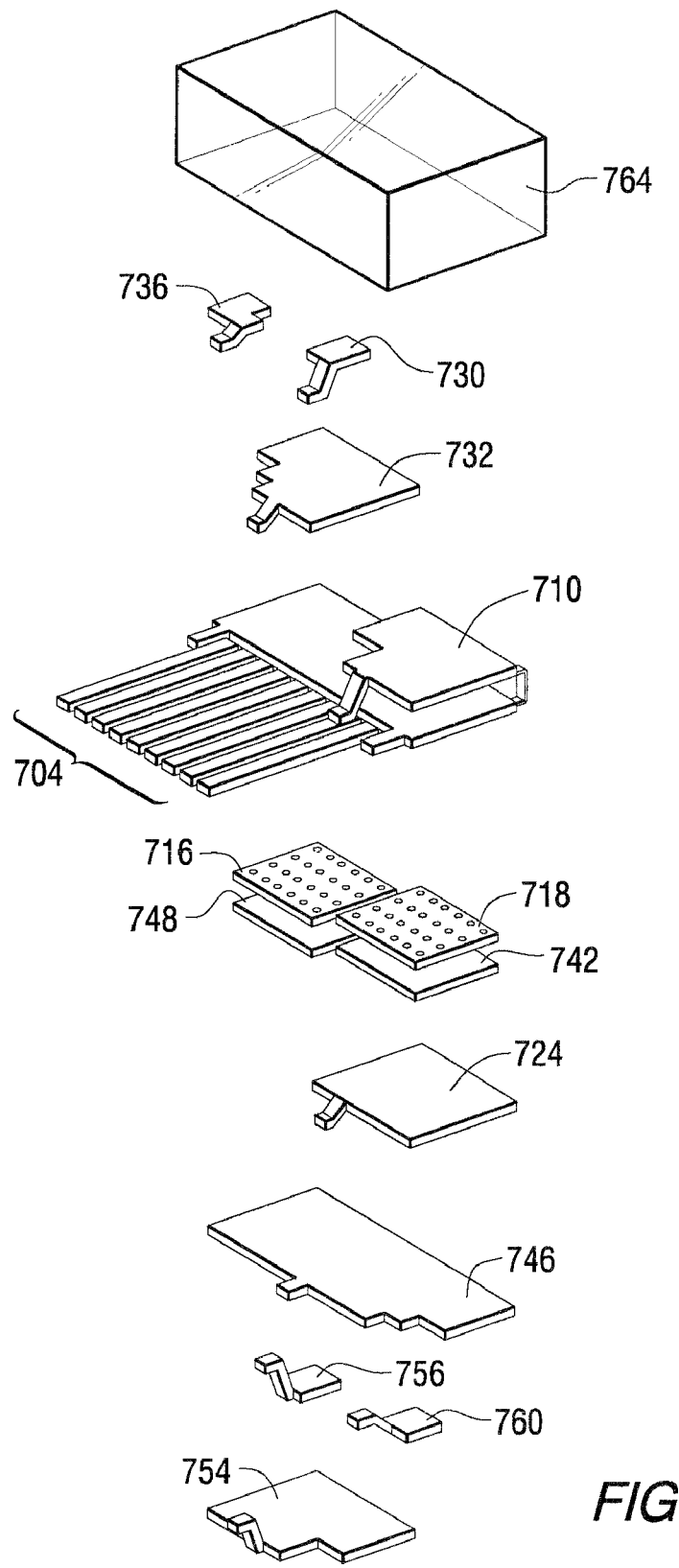
FIG. 11 is an exploded view of the second embodiment.

FIG. 11 is an exploded view of the components of the embodiment shown in FIG. 6.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A multiphase synchronous buck converter with at least four dice and at least ten leads comprising:
   a first die with a first source, a first gate, and a first drain, wherein the first die is attached to a first die attach pad which is integral with a second die attach pad, the second die attach pad being disposed parallel to but in a different plane from the first die attach pad;
   a second die with a second source, a second gate, and a second drain, the second drain is electrically connected to the first source, the second die being disposed on a third die attach pad that is disposed parallel to but in a different plane from both the first and second die attach pads;
   a third die with a third source, a third gate, and a third drain;
   a fourth die with a fourth source, a fourth gate, and a fourth drain, the fourth source is electrically connected to the third drain;
   a first lead electrically connected to the first gate;
   a second lead electrically connected to the first source and the second drain;
   a third lead electrically connected to the second source;
   a fourth lead electrically connected to the second gate;
   a fifth lead electrically connected to the first drain;
   a sixth lead electrically connected to the third gate;
   a seventh lead electrically connected to the third source;
   an eighth lead electrically connected to the third drain and fourth source;
   a ninth lead electrically connected to the fourth gate; and
   a tenth lead electrically connected to the fourth drain.

2. The buck converter of claim 1, further comprising a molding compound, wherein the first through fourth dice are encased in the molding compound and a portion of the first through tenth leads are so encased.

3. The buck converter of claim 2, wherein the first through tenth leads are parallel.

4. The buck converter of claim 3, wherein the first through tenth leads are coplanar.

5. A multiphase synchronous buck converter comprising
   a first die attach pad in a first plane with a first lead and a second lead and, connected to the first die attach pad by a conductive bridge, a second die attach pad, the second die attach pad being disposed parallel to, but in a second plane separated from, the first plane;
   a third die attach pad with a third lead and a fourth lead, the third die attach pad being disposed parallel to, but in a third plane separated from, the first and second plane;
   a fourth die attach pad with a fifth lead, the fourth die attach pad being disposed parallel to, but in a fourth plane separated from, the first and second plane;
   a fifth die attach pad with a sixth lead and a seventh lead, the fifth die attach pad being disposed parallel to, but in a fifth plane separated from the first, second, third and fourth planes;
   a sixth die attach pad with an eighth lead, a ninth lead, and a tenth lead, the sixth die attach pad being disposed parallel to, but in a sixth plane separated from the first, second, third, fourth and fifth planes;
   a first die with a first source, a first gate, and a first drain disposed between the first die attach pad and the fourth die attach pad such that the first source connects to the second lead, the first gate connects to the first lead, and the first drain connects to the fifth lead;
   a second die with a second source, a second gate, and a second drain disposed between the first die attach pad and the second die attach pad such that the second source connects to the third lead, the second gate connects to the fourth lead, and the second drain connects to the second lead through the second die attach pad;
   a third die with a third source, a third gate, and a third drain disposed between the fifth die attach pad and the sixth die attach pad such that the third source connects to the seventh lead, the third gate connects to the sixth lead, and the third drain connects to the eighth lead;
   a fourth die with a fourth source, a fourth gate, and a fourth drain disposed on the sixth die attach pad such that the fourth drain connects to the tenth lead, the fourth gate connects to the ninth lead, and the fourth source connects to the eighth lead.

6. The buck converter of claim 5, further comprising a molding compound, wherein the first through fourth dice are encased in the molding compound and a portion of the first through tenth leads are so encased.

7. The buck converter of claim 6, wherein the first through tenth leads are parallel.

8. The buck converter of claim 7, wherein the first through tenth leads are coplanar.

9. A process for forming a multiphase buck converter package, comprising the steps of:
   providing a lead frame with a plurality of leads, a first die attach pad with a first lead and a second lead, a second die attach pad, and a conductive bridge connecting the first and second die attach pads, wherein the first pad, the second, pad and the bridge are in a first plane;

mounting a first die with a first source, a first gate, and a first drain to the first die attach pad such that the first source connects to the second lead and the first gate connects to the first lead;

mounting a second die with a second source, a second gate, and a second drain to a third die attach pad, wherein the third die attach pad has a third lead and a fourth lead and the second source contacts the third lead and the second gate contacts the fourth lead;

mounting the third die attach pad to the lead frame such that the third and fourth leads are extended by contact with the plurality of leads;

bending the bridge such that the second die attach pad is disposed in a second plane parallel, but separated from, the first plane and the second die attach pad contacts the second drain, thus connecting the second drain to the second lead;

disposing a fourth die attach pad with an insulator disposed on one surface such that the fourth die attach pad is electrically connected to the first drain of the first die, wherein the fourth die attach pad has a fifth lead;

mounting a third die with a third source, a third gate, and a third drain to a fifth die attach pad, wherein the fifth die attach pad has a sixth lead and a seventh lead and the third source contacts the seventh lead and the third gate contacts the sixth lead;

mounting the fifth die attach pad to the lead frame in a fourth plane parallel to, but separated from, the first plane, such that the sixth and seventh leads are extended by contact with the plurality of leads;

mounting a fourth die with a fourth source, a fourth gate, and a fourth drain to a sixth die attach pad, wherein the sixth die attach pad has an eighth lead, a ninth lead, and a tenth lead such that the fourth drain contacts the tenth lead, the fourth gate contacts the ninth lead, and the fourth source contacts the eighth lead;

mounting the sixth die attach pad to the lead frame in a fifth plane parallel to, but separated from, the first plane, such that the third drain contacts the sixth die attach pad, thus connecting the third drain to the eighth lead.

10. The process as recited in claim 9, further comprising the step of encasing the buck converter within a molding compound such that a portion of the plurality of leads extends outside of the molding compound.

11. A semiconductor device comprising four mosfet semiconductor devices mounted on six die attach pads wherein the six die attach pads are disposed in parallel but different planes to form a vertical stack of die attached pads, with a first die attach pad being integral with a second die attach pad and wherein at least two of the four said devices are located between a respective pair of adjacent die attach pads, said devices and die pads encapsulated in an insulating material, and elongated leads disposed in a common plane parallel to the planes of the die attach pads and each lead with one end connected to a terminal of one of the mosfets and the other end disposed outside the insulating material, wherein each of the devices has a source, gate and drain, the source of the fourth die being electrically connected to the drain of the third die to form a packaged multiphase synchronous buck converter.

12. The packaged multiphase synchronous buck converter of claim 11 comprising nine or ten leads.

13. A process for forming a semiconductor device comprising the steps of:

mounting at least four mosfet dies on four die attach pads;

arranging the four die pads and at least two other die pads into a vertical stack of parallel die attach pads, wherein a first die attach pad is connected to a second die attach pad by a bridge, and wherein the process includes bending the bridge after attaching the first mosfet die to the first die attach pad such that the second die attach pad is disposed in a second plane that is parallel but separated from the first plane;

providing nine or ten leads in a common plane, each lead having one end connected to a terminal of one of the mosfets and the other end outside the package;

encapsulating the four mosfets, six die attach pads and the ends of the leads proximate the mosfets in an insulating material, to form a packaged multiphase synchronous buck converter.

* * * * *